United States Patent
Ju

(10) Patent No.: US 6,229,187 B1
(45) Date of Patent: May 8, 2001

(54) FIELD EFFECT TRANSISTOR WITH NON-FLOATING BODY AND METHOD FOR FORMING SAME ON A BULK SILICON WAFER

(75) Inventor: Dong-Hyuk Ju, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/420,972

(22) Filed: Oct. 20, 1999

(51) Int. Cl.$^7$ ................................................... H01L 29/72
(52) U.S. Cl. ........................ 257/396; 257/397; 257/401; 257/513; 257/520
(58) Field of Search ..................................... 257/396, 397, 257/401, 513, 520, 901

(56) References Cited

U.S. PATENT DOCUMENTS

| | | |
|---|---|---|
| 4,682,407 | 7/1987 | Wilson et al. . |
| 4,888,300 | 12/1989 | Burton . |
| 5,262,346 | 11/1993 | Bindal et al. . |
| 5,391,503 | 2/1995 | Miwa et al. . |
| 5,401,998 | 3/1995 | Chiu et al. . |
| 5,466,630 | 11/1995 | Lur . |
| 5,489,792 | 2/1996 | Hu et al. . |
| 5,494,837 | * 2/1996 | Subramanian et al. . |
| 5,543,338 | 8/1996 | Shimoji . |
| 5,618,345 | 4/1997 | Saitoh et al. . |
| 5,620,912 | 4/1997 | Hwang et al. . |
| 5,674,760 | * 10/1997 | Hong . |
| 5,683,932 | 11/1997 | Bashir et al. . |
| 5,702,989 | 12/1997 | Wang et al. . |
| 5,804,856 | 9/1998 | Ju . |
| 5,811,588 | 9/1998 | Tyson et al. . |
| 5,811,855 | 9/1998 | Tyson et al. . |
| 5,825,696 | 10/1998 | Hideaka et al. . |
| 5,846,857 | 12/1998 | Ju . |
| 5,877,046 | 3/1999 | Yu et al. . |
| 5,879,975 | 3/1999 | Karlsson et al. . |
| 5,894,152 | 4/1999 | Jaso et al. . |
| 5,907,768 | 5/1999 | Malta et al. . |
| 5,972,758 | 10/1999 | Liang . |
| 5,976,945 | 11/1999 | Chi et al. . |
| 5,977,579 | 11/1999 | Noble . |
| 6,004,864 | 12/1999 | Huang et al. . |
| 6,008,104 | 12/1999 | Schrems . |
| 6,066,527 | 5/2000 | Kudelka et al. . |

OTHER PUBLICATIONS

S. Wolf and R.N. Tauber, Silicon Processing for the VLSI ERA, vol. 1, p. 531.

\* cited by examiner

*Primary Examiner*—Edward Wojciechowicz
(74) *Attorney, Agent, or Firm*—Renner, Otto, Boisselle & Sklar, LLP

(57) ABSTRACT

A silicon on insulator (SOI) wafer is formed with an unoxidized perforation in the insulating silicon dioxide buried oxide layer. A field effect transistor (FET) structure on the SOI wafer is located above the unoxidized perforation such that the unoxidized perforation provides for electrical coupling between the channel region of the FET with the bulk silicon substrate to eliminate the floating body effect caused by charge accumulation in the channel regions due to historical operation of the FET. The method of forming the FET includes masking a silicon wafer prior to an oxygen implantation process to form the unoxidized perforated buried oxide layer in the wafer.

12 Claims, 2 Drawing Sheets

FIELD EFFECT TRANSISTOR WITH NON-FLOATING BODY AND METHOD FOR FORMING SAME ON A BULK SILICON WAFER

TECHNICAL FIELD

The present invention relates generally to silicon on insulator (SOI) field effect transistor structures, and more specifically to SOI substrate structures advantageous in the fabrication of such transistors.

BACKGROUND OF THE INVENTION

Conventional or bulk semiconductor devices are formed in semiconductive material by implanting a well of either P-type or N-type conductivity silicon in a silicon substrate wafer of the opposite conductivity. Gates and source/drain diffusions are then manufactured using commonly known processes. These form devices known as metal-oxide-semiconductor (MOS) field effect transistors (FETs). When a given chip uses both P-type and N-type, it is known as a complimentary metal oxide semiconductor (CMOS). Each of these transistors must be electrically isolated from the others in order to avoid shorting the circuits. A relatively large amount of surface area is needed for the electrical isolation of the various transistors. This is undesirable for the current industry goals for size reduction. Additionally, junction capacitance between the source/drain and the bulk substrate and "off" state leakage from the drain to the source both increase power consumption. Junction capacitance also slows the speed at which a device using such transistors can operate. These problems result in difficulties in reducing the size, power consumption, and voltage of CMOS technology devices.

In order to deal with the junction capacitance and "off state" leakage problem as well as obtain reduced size, silicon on insulator technology (SOI) has been gaining popularity. A SOI wafer is formed from a bulk silicon wafer by using conventional oxygen implantation techniques to create a buried oxide layer at a predetermined depth below the surface. The implanted oxygen oxidizes the silicon into insulating silicon dioxide in a guassian distribution pattern centered at the predetermined depth to form the buried oxide layer. The problem with forming field effect transistors on an SOI wafer is the floating body effect. The floating body effect occurs because the buried oxide layer isolates the channel, or body, of the transistor from the fixed potential silicon substrate and therefore the body takes on charge based on recent operation of the transistor. The floating body effect causes the current-to-voltage curve for the transistor to distort or kink, which in turn causes the threshold voltage for operating the transistor to fluctuate. This problem is particularly apparent for passgate devices such as those used in dynamic random access memory (DRAM) wherein it is critical that the threshold voltage remain fixed such that the transistor remains in the off position to prevent charge leakage from the storage capacitor. Another problem associated with SOI technology is heat build up. The insulating silicon dioxide in the buried oxide layer is a poor heat conductor and prevents effective heat dissipation into bulk silicon below the buried oxide layer.

Accordingly, there is a strong need in the art for a semiconductor field effect transistor structure, and a method for forming such structure, that includes the low junction capacitance and low "off" state leakage characteristics of the SOI FET but does not suffer the disadvantages of a floating body potential and heat build up.

SUMMARY OF THE INVENTION

A first object of this invention is to provide a method of forming a silicon on insulator wafer with a perforated buried oxide layer by masking a portion of the surface of a silicon substrate to form a masked region and an unmasked region and performing an oxygen implant to oxidize the silicon substrate to form an insulating layer of silicon dioxide beneath the unmasked region and an unoxidized perforation beneath the masked region.

In the preferred embodiment, the masking step includes applying a layer of photoresist to the top surface of the wafer, exposing the photoresist in the masked region to UV illumination, and developing the photoresist to harden the photoresist in the masked region and remove the photoresist from the unmasked region. After performing the oxygen implantation, the photoresist mask is removed.

To eliminate the floating body effect, the unoxidized perforation corresponds to an active region of a field effect transistor to be fabricated on said wafer. The active region includes a central channel region and a source region and drain region on opposing sides of the central channel region. To reduce or eliminate junction capacitance, the unoxidized perforation preferably has a cross sectional area that is less than or equal to the cross sectional area of the of the channel region.

A second object of this invention is to provide a method of fabricating a field effect transistor by: a) masking the surface of a silicon substrate to create a masked perforation region and an unmasked insulating region; b) performing an oxygen implant to create a planar layer of insulating silicon dioxide beneath the surface of the silicon substrate in the unmasked insulating region; c) masking the surface of the silicon substrate to create a masked active region and an unmasked trench region; d)etching an insulating trench in the unmasked trench area; e) masking the surface of the silicon substrate to create a masked channel region and each of an unmasked source region and drain region; and f) doping each of the unmasked source region and drain region to silicon of the opposite conductivity as the silicon substrate.

Preferably the step of masking the surface of a silicon substrate to create a masked perforation region and an unmasked insulating region includes applying a layer of photoresist to the top surface of the wafer, exposing the photoresist in the masked region to UV illumination, and developing the photoresist to harden the photoresist in the masked region and remove the photoresist from the unmasked region.

Preferably the step of masking the surface of the silicon substrate to create a masked channel region and each of an unmasked source region and drain region includes growing a layer of silicon dioxide on the surface of the silicon substrate and depositing a layer of polysilicon on the surface of the silicon dioxide and patterning and etching the polysilicon to remove the polysilicon from the unmasked source region and drain region.

Yet a third objective of this invention is to provide a method of fabricating a field effect transistor including: a) forming a planar layer of insulating silicon dioxide beneath the surface of the silicon substrate, wherein the planar layer includes a perforated region of semiconductor silicon; b) forming an insulating trench extending between the surface of the silicon substrate and the planar layer to define an active region electrically coupled to the perforated region; c) forming a gate oxide and polysilicon gate on a portion of the active region to define a channel region, a source region, and a drain region; and d) doping each of source region and the drain region to silicon of the opposite conductivity as the channel region.

Preferably the step of forming a planar layer of insulating silicon dioxide includes applying a mask to the top surface of the wafer to define a masked region over the perforated region and an unmasked region wherein the mask is impervious to an ION beam of oxygen and implanting a high dose of oxygen into the silicon substrate in the unmasked region by exposing the wafer to an ION beam of oxygen. The substrate is heated to bond the implanted oxygen with the silicon substrate to form the planar layer of insulating silicon dioxide.

As previously discussed, the step of applying a mask includes applying a layer of photoresist to the top surface of the wafer, exposing the masked region to UV illumination; and developing the photoresist to harden the photoresist in the masked region and remove the photoresist in the unmasked region;

A fourth objective of this invention is to provide a field effect transistor formed on a semiconductor substrate including an active region, including a central channel region and a source region and a drain region disposed on opposite sides of said central channel region, an insulating buried oxide layer in said semiconductor substrate isolating at least a portion of the active region from the semiconductor substrate, a conductive perforation in the buried oxide layer electrically coupling the channel region to the semiconductor substrate; and an insulating trench extending around the perimeter of the active region to isolate the active region from other structures formed on said semiconductor substrate. The central channel region, the conductive perforation, and the semiconductor substrate are all the same conductivity and the source region and drain region are of an opposite conductivity.

A fifth object of this invention is to provide a semiconductor device including a plurality of field effect transistors formed on a semiconductor substrate wherein each transistor includes: a) an active region, including a central channel region and a source region and a drain region each on opposing sides of the central channel region; b) a bridge region, with a cross section area smaller than a cross section of the active body region, conductively coupling the central channel region with said semiconductor substrate; and an insulator isolating said active body region and said bridge region from at least one other of said plurality of transistors. The central channel region, the bridge region, and the semiconductor substrate are all the same conductivity and the source region and drain region are of an opposite conductivity.

DESCRIPTION OF THE PREFERRED EMBODIMENTS

Figure 1:
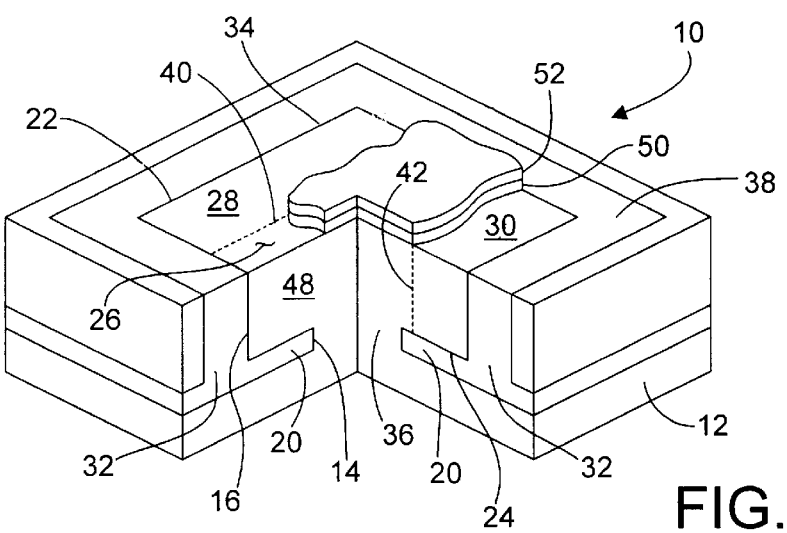
FIG. 1 is a perspective view, partially cut away, of a field effect transistor (FET) formed on silicon substrate with a perforated buried oxide layer in accordance with this invention.

The present invention will now be described in detail with reference to the drawings. In the drawings, like reference numerals are used to refer to like elements throughout.

Referring to FIG. 1, it can be seen that an active region 48 of a field effect transistor 10 of this invention includes a channel region 26, a source region 28, and a drain region 30. In the exemplary embodiment of this invention, the channel region 26 is preferably P-conductivity silicon while the source region 28 and the drain region 30 are each N-conductivity silicon to form two semiconductor junctions 40 and 42. However, in accordance with known silicon technology, the channel region 26 may be N-conductivity silicon while each of the source region 28 and the drain region 30 are P-conductivity silicon. The active region is isolated by an insulating trench 32 which extends from the surface 38 to a perforated buried oxide layer 20. The insulating trench 32 has side walls 16 which define the perimeter 22 of the active region 48 and insulates the active region 48 from other structures formed in the silicon substrate 12. The perforated buried oxide layer 20 forms the bottom surface 24 of the active region 48 and includes perforated region 36 wherein semi-conductive silicon electrically couples the channel region 26 of the active region 48 to the bulk silicon substrate 12.

It should be appreciated that because the semi-conductive silicon in the perforated region 36 electrically couples the channel region 26 to the bulk silicon substrate 12, the channel region 26 potential will always remain at the potential of the silicon substrate 12 and can not accumulate a charge, or float, based on historical operation of the FET 10. It should also be appreciated that because the cross sectional area of the perforated region 36 is significantly smaller than the cross sectional area of the active region 48, there is no semiconductor junction, or minimal sized semiconductor junction, between either the source region 28 or the drain region 30 and the silicon substrate 12 thereby reducing junction capacitance.

Figure 2:
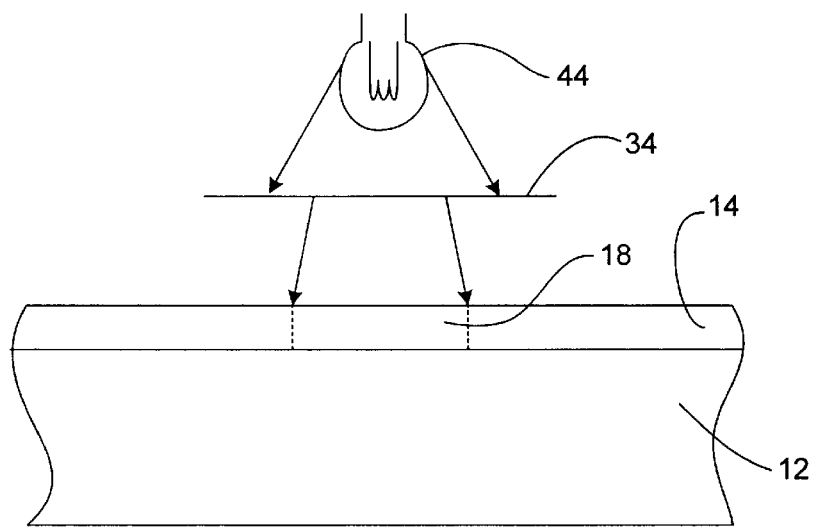
FIG. 2 is a cross sectional view of a first step in the fabrication of the FET of this invention.
Figure 3:
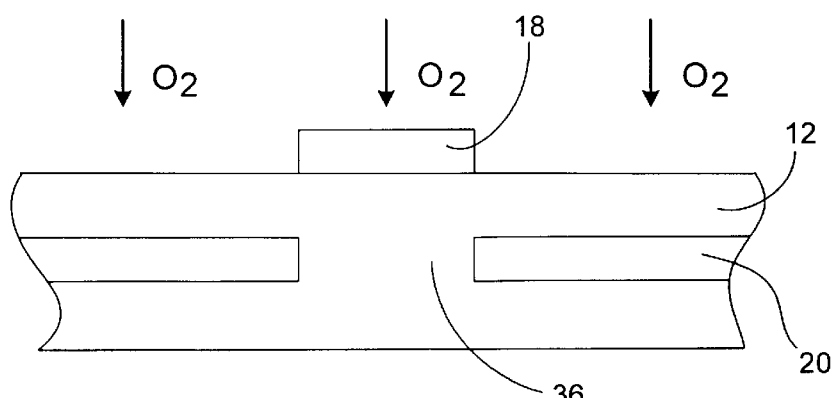
FIG. 3 is a cross sectional view of a second step in the fabrication of the FET of this invention.

The first step in the fabrication of the FET 10 of this invention is to fabricate a silicon on insulator wafer with a perforated buried oxide layer. A photoresist mask 18 is formed on the surface of the wafer above perforation region 36 to define perforated region 36. More specifically, a UV sensitive photoresist layer 14 is applied to the top surface of the silicon substrate 12 a shown in FIG. 2. Conventional photolithography techniques are used to pattern the mask 18 and develop the photoresist. More specifically, a UV light source 44 and reticle 34 provide collimated light used to expose and pattern the photoresist layer 14 in order to form the mask 18. Assuming that a positive photoresist is used, a developer solution hardens the photoresist in the unexposed area (e.g. the photoresist mask 18) and the UV light dissolves and the developer washes away the photoresist in the exposed area as shown in FIG. 3.

In a second step, conventional Separation by Implantation of Oxygen (SIMOX) techniques are used to form the perforated buried oxide layer 20 in the silicon substrate 12. An ION beam is used to implant a high dose of oxygen, greater than 10 E16 atoms per square centimeter, into the silicon substrate. The dose and beam energy parameters of the SIMOX process are controlled to control a resultant gaussian concentration of oxygen implanted in the wafer as a function of depth below the surface. Typically the dose and beam energy are selected such that the highest concentration of implanted oxygen (e.g. the peak of the gaussian distribution) is at the desired depth of the perforated buried oxide layer 20 and lower concentrations exist both above and below the high concentration layer. A heat treatment then bonds the implanted oxygen with the silicon to form silicon dioxide (e.g. the high concentration layer becomes the buried oxide layer). Because the photoresist mask 18 blocks the ION beam and thus blocks the implantation of oxygen in the area of the substrate covered by the photoresist mask 18 the masked portion becomes the perforated region 36 after the buried oxide layer is formed in the unmasked region as shown in FIG. 3.

It should be appreciated that creating the buried oxide layer does not include removing silicon and replacing it with silicon dioxide. Instead, a portion of the silicon substrate is oxidized (e.g. chemically altered by the oxygen implant) to become the silicon dioxide in the buried oxide layer 20. Therefore, the perforated region 36 is a region of unoxidized silicon that electrically couples the unoxidized silicon substrate above the buried oxide layer 20 with the unoxidized silicon substrate below the buried oxide layer 20.

Figure 4:
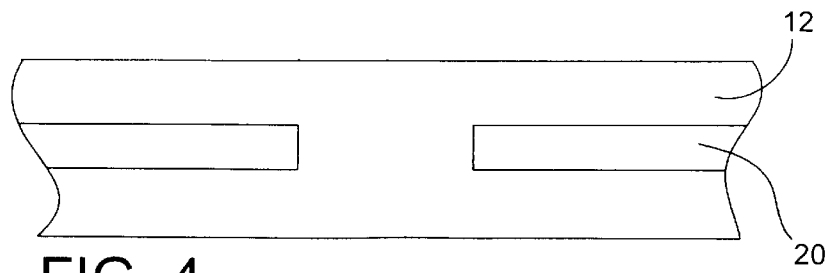
FIG. 4 is a cross sectional view of a third step in the fabrication of the FET of this invention.

In a third step, the photoresist mask 18 is removed resulting in silicon on insulator wafer including a silicon substrate 12 with a perforated buried oxide layer 20 as shown in FIG. 4.

Figure 5:
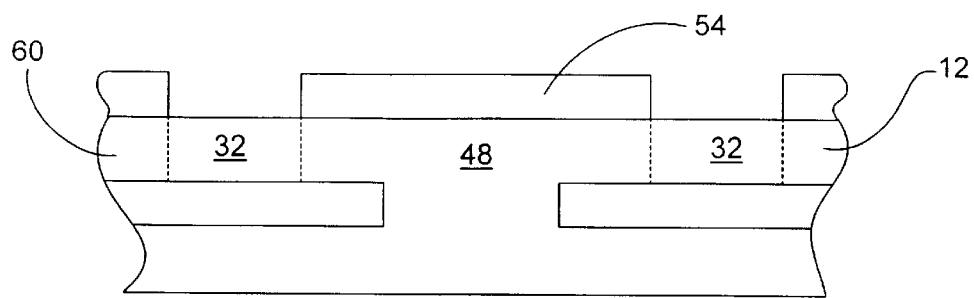
FIG. 5 is a cross sectional view of a fourth step in the fabrication of the FET of this invention.

In a fourth step, a thin layer of oxide approximately 150–200 Angstroms thick (not shown) is formed on the top surface of the silicon substrate 12 and a silicon nitride mask 54 is formed thereon. The mask 54 covers and protects the substrate in the area where the active region 48 of FET 10 is to be formed while leaving the area where the insulating trench 32 is to be formed exposed as shown in FIG. 5. The silicon nitride mask 54 is formed by depositing a layer of silicon nitride, approximate 1,500–2,000 Angstroms thick, on the top surface of the oxide and patterning and etching the silicon nitride using conventional photolithography techniques wherein 1) a layer of a UV sensitive photoresist compound is applied to the surface of the silicon nitride; 2) a UV light source and a reticle provide collimated illumination used to expose and pattern the photoresist; 3) a developer solution hardens the unexposed areas of the photoresist while the UV light dissolves the photoresist and the developer washes it away in the exposed portions thereby leaving the unexposed portions as a mask on the surface of the silicon nitride; and 4) a dry etch with an etching compound that etches silicon nitride while not etching the photoresist removes the silicon nitride layer in the areas that are not masked with the photoresist thereby creating the silicon nitride mask below the photoresist mask.

Figure 6:
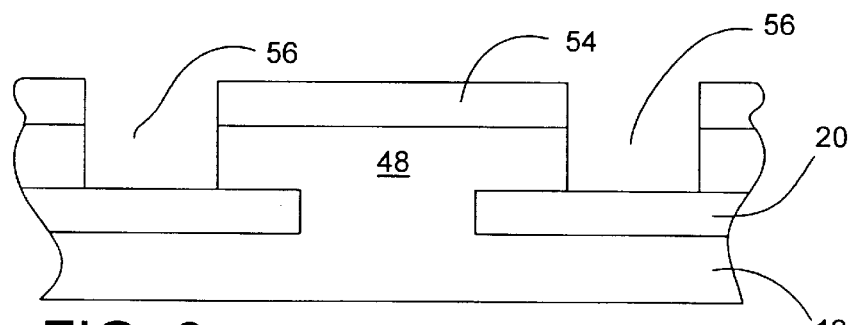
FIG. 6 is a cross sectional view of a fifth step in the fabrication of the FET of this invention.

Thereafter, in a fifth step, the unmasked portions of the silicon substrate 12 (e.g. the portions where the silicon nitride mask has been etched away) are etched away to form an open trench 56 (approximate 3,000–5,000 Angstrom deep) as shown in FIG. 6. It should be appreciated that the step of etching the open trench 56 may be combined with the step of etching the silicon nitride mask 54 from step four and different etching chemistry will be used for etch of each of the silicon nitride 54, oxide, and silicon substrate 12. Because the open trench 56 will later be filled with silicon dioxide to become the insulating trench 32 described in the discussion of FIG. 1, the depth of the open trench 56 needs to extend at least past the upper surface of the perforated buried oxide layer 20. The etching process for the silicon substrate is typically an anisotropic dry etch using hydrogen bromide (HBr) which has selectivity characteristics such that it etches the silicon substrate 12 but not the silicon nitride mask 54.

Figure 7:
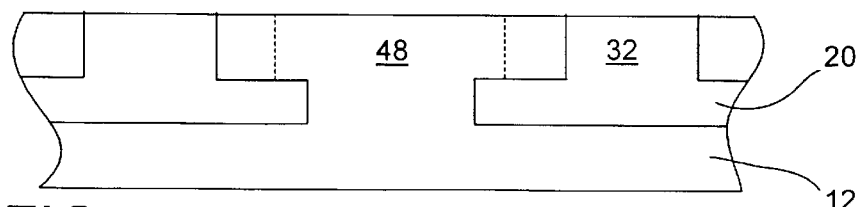
FIG. 7 is a cross sectional view of a sixth step in the fabrication of the FET of this invention.

In a sixth step, the open trench 56 is filled with silicon dioxide to form insulating trench 32. Filling the open trench 56 preferably uses any known technique for forming silicon dioxide in an open trench such as filling the trench with SiH4 or TEOS and subsequently oxidizing either of such compounds to form insulating silicon dioxide. After filling the open trench 56, the surface of the wafer is polished using a chemical mechanical polish to remove any excess silicon dioxide layer and the remaining silicon nitride mask as shown in FIG. 7.

Figure 8:
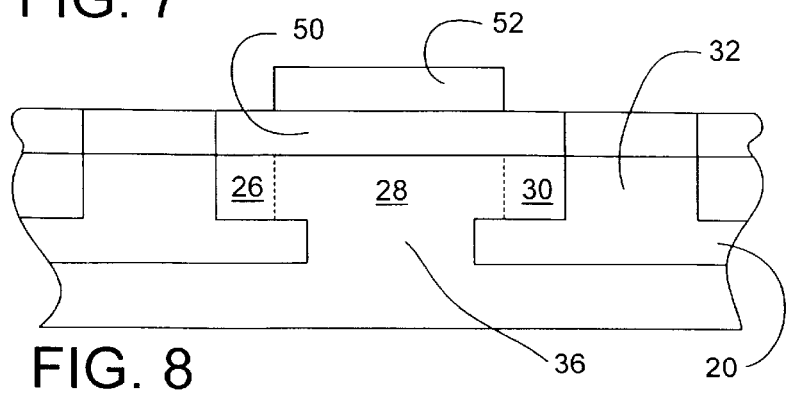
FIG. 8 is a cross sectional view of a seventh and eighth steps in the fabrication of the FET of this invention.

In a seventh step, a gate oxide layer 50, and a polysilicon gate 52 are formed on the top surface of the substrate 12 to define the channel region 26 in a conventional CMOS self aligned gate, source, and drain process. The gate oxide layer 50 is typically grown on the surface of the active region 48 using a thermal oxidation process and a polysilicon layer is deposited on top of the gate oxide layer 50 using a low pressure chemical vapor deposition (LPCVD) process. The polysilicon layer is then patterned and etched using the photolithography method discussed earlier to create polysilicon gate 52 which defines the channel region of the FET 10 of this invention as shown in FIG. 8.

In the eighth step, the portions of the silicon substrate silicon on opposing sides of the P-type silicon in the channel region of the FET 10 that are not masked by the gate applied in the $7^{th}$ step are doped into N-type silicon. Doping is typically performed using Ion implantation techniques. Ions of an N-type dopant 54, such as arsenic are accelerated to a high velocity in an electric field and impinge on the target wafer. Because the ions cannot penetrate the poly-silicon gate, the poly-silicon gate effectively operates as a mask which results in doping only the exposed source region and drain region as shown in FIG. 8.

It should be appreciated that the foregoing processes of fabricating a field effect transistor on a silicon on insulator wafer with a perforated buried oxide layer results in a unique transistor structure that eliminates the floating body effect found in known SOI FET structures. The perforated regions of the buried oxide layer electrically couple the channel region of the FET to the silicon substrate to prevent the potential of the channel region from floating based on historical operation of the FET. It should also be appreciated that the cross sectional area of the perforated regions preferably is smaller than the cross sectional area of the channel region to reduce or eliminate junction capacitance problems associated with known CMOS FETs.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A field effect transistor formed on a semiconductor substrate comprising:
   a) an active region, including a central channel region and a source region and a drain region disposed on opposite sides of said central channel region;
   b) an insulating buried oxide layer in said semiconductor substrate isolating at least a portion of the active region from the semiconductor substrate c) a conductive perforation in the buried oxide layer electrically coupling the channel region to the semiconductor substrate; and
d) an insulating trench extending around the perimeter of the active region to isolate the active region from other structures formed on said semiconductor substrate;
wherein the conductive perforation is narrower than the central channel region in a direction from the source region to the drain region.

2. The field effect transistor of claim 1 wherein the central channel region, the conductive perforation, and the semiconductor substrate are all the same conductivity and the source region and drain region are of an opposite conductivity.

3. A semiconductor device including a plurality of field effect transistors formed on a semiconductor substrate, each transistor comprising:
a) an active region, including a central channel region and a source region and a drain region each on opposing sides of the central channel region;
b) a bridge region, with a cross section area smaller than a cross section of the central channel region, conductively coupling the central channel region with said semiconductor substrate; and
c) an insulator isolating said active body region and said bridge region from at least one other of said plurality of transistors.

4. The semiconductor device of claim 3 wherein the central channel region, the bridge region, and the semiconductor substrate are all the same conductivity and the source region and drain region are of an opposite conductivity.

5. The transistor of claim 1, wherein the conductive perforation is narrower than the central channel region in any corresponding direction.

6. The transistor of claim 1, wherein the substrate, the active region, and the conductive perforation are all parts of a single piece of silicon.

7. The transistor of claim 1, wherein the insulating trench is an oxide-filled trench.

8. The transistor of claim 1, wherein the conductive perforation has a cross-sectional area less than a cross-sectional area of the channel region.

9. The device of claim 3, wherein for each of the transistors the bridge region is narrower than the central channel region in a direction from the source region to the drain region.

10. The device of claim 9, wherein for each of the transistors the bridge region is narrower than the central channel region in any corresponding direction.

11. The device of claim 3, wherein the substrate, the active regions, and the bridge regions are all parts of a single piece of silicon.

12. The device of claim 3, further comprising a buried oxide layer perforated by the bridge regions.

* * * * *